(12) United States Patent
Shirai et al.

(10) Patent No.: US 10,604,201 B2
(45) Date of Patent: Mar. 31, 2020

(54) TELESCOPIC APPARATUS

(71) Applicant: SHIMANO INC., Sakai (JP)

(72) Inventors: Toyoto Shirai, Sakai (JP); Yuki Sakagawa, Sakai (JP); Yoshimitsu Miki, Sakai (JP)

(73) Assignee: SHIMANO INC., Sakai (JP)

( * ) Notice: Subject to any disclaimer, the term of this patent is extended or adjusted under 35 U.S.C. 154(b) by 0 days.

(21) Appl. No.: 15/940,942

(22) Filed: Mar. 29, 2018

(65) Prior Publication Data

US 2019/0300085 A1   Oct. 3, 2019

(51) Int. Cl.
| *F16M 13/00* | (2006.01) |
| *B62J 1/08* | (2006.01) |
| *C22F 1/00* | (2006.01) |
| *H01L 41/09* | (2006.01) |
| *F16B 7/10* | (2006.01) |

(52) U.S. Cl.
CPC ............ *B62J 1/08* (2013.01); *C22F 1/006* (2013.01); *F16B 7/10* (2013.01); *H01L 41/0986* (2013.01); *B62J 2001/085* (2013.01)

(58) Field of Classification Search
CPC .......... B62J 2001/085; B62J 1/00; B62J 1/06; B62K 19/36
USPC ...................................... 248/157, 161, 188.5
See application file for complete search history.

(56) References Cited

U.S. PATENT DOCUMENTS

| 7,673,936 B2* | 3/2010 | Hsu ............................. B62J 1/08 |
| | | 297/215.13 |
| 8,177,251 B2* | 5/2012 | Shirai ......................... B62J 1/08 |
| | | 280/288.4 |
| 9,073,592 B2* | 7/2015 | Hsu ............................. B62J 1/08 |
| 9,126,647 B2* | 9/2015 | Kuo ............................ B62J 1/08 |
| 9,487,256 B2* | 11/2016 | Hsu ............................. B62J 1/08 |
| 9,969,448 B1* | 5/2018 | Chen ........................... B62J 1/10 |
| 2005/0263359 A1 | 12/2005 | Mankame et al. |
| 2012/0228906 A1 | 9/2012 | McAndrews et al. |
| 2015/0197308 A1 | 7/2015 | Butora et al. |
| 2017/0341692 A1* | 11/2017 | Shirai ......................... B62J 1/08 |

FOREIGN PATENT DOCUMENTS

| DE | 102016010857 | 4/2017 |
| DE | 102016225489 | 6/2018 |
| WO | WO 2014/029759 | 2/2014 |

* cited by examiner

*Primary Examiner* — Steven M Marsh
(74) *Attorney, Agent, or Firm* — Mori & Ward, LLP

(57) ABSTRACT

A telescopic apparatus comprises a first tube, a second tube, a movable member, and an actuator. The second tube is telescopically and movably coupled to the first tube. The movable member is movable relative to the first tube in a telescopic direction. The actuator is configured to be deformable so as to move the movable member relative to the first tube in the telescopic direction. The actuator is provided in at least one of the first tube and the second tube.

18 Claims, 13 Drawing Sheets

TELESCOPIC APPARATUS

BACKGROUND OF THE INVENTION

Field of the Invention

The present invention relates to a telescopic apparatus.

Discussion of the Background

For example, U.S. Patent Application Publication No. 2012/0228906 describes an adjustable assembly for a bicycle.

SUMMARY OF THE INVENTION

In accordance with a first aspect of the present invention, a telescopic apparatus comprises a first tube, a second tube, a movable member, and an actuator. The second tube is telescopically and movably coupled to the first tube. The movable member is movable relative to the first tube in a telescopic direction. The actuator is configured to be deformable so as to move the movable member relative to the first tube in the telescopic direction. The actuator is provided in at least one of the first tube and the second tube.

With the telescopic apparatus according to the first aspect, it is possible to actuate the movable member using deformation of the actuator.

In accordance with a second aspect of the present invention, the telescopic apparatus according to the first aspect is configured so that the actuator is entirely provided in the at least one of the first tube and the second tube.

With the telescopic apparatus according to the second aspect, it is possible to make the telescopic apparatus compact.

In accordance with a third aspect of the present invention, the telescopic apparatus according to the first or second aspect is configured so that the actuator has an elongated shape in the telescopic direction.

With the telescopic apparatus according to the third aspect, it is possible to utilize an inner space of the telescopic apparatus as a space for the actuator.

In accordance with a fourth aspect of the present invention, the telescopic apparatus according to any one of the first to third aspects is configured so that the actuator is configured to deform in accordance with stimulation including at least one of electric charge, heat and biasing force.

With the telescopic apparatus according to the fourth aspect, it is possible to simplify the structure of the actuator.

In accordance with a fifth aspect of the present invention, the telescopic apparatus according to the first aspect is configured so that the actuator is configured to extend in a first direction in accordance with the stimulation to generate a pushing movement of the movable member.

With the telescopic apparatus according to the fifth aspect, it is possible to push the movable member using deformation of the actuator.

In accordance with a sixth aspect of the present invention, the telescopic apparatus according to the fifth aspect is configured so that the first direction is parallel to the telescopic direction.

With the telescopic apparatus according to the sixth aspect, it is possible to make telescopic apparatus compact.

In accordance with a seventh aspect of the present invention, the telescopic apparatus according to the fifth aspect is configured so that the actuator increases in length in response to an increase in the stimulation to generate the pushing movement of the movable member.

With the telescopic apparatus according to the seventh aspect, it is possible to push the movable member using deformation of the actuator.

In accordance with an eighth aspect of the present invention, the telescopic apparatus according to the fifth aspect is configured so that the actuator decreases in length in response to a decrease in the stimulation to release the pushing movement of the movable member.

With the telescopic apparatus according to the eighth aspect, it is possible to release the pushing movement of the movable member using deformation of the actuator.

In accordance with a ninth aspect of the present invention, the telescopic apparatus according to the fourth aspect is configured so that the actuator is configured to shrink in a second direction in accordance with the stimulation to generate a pulling movement of the movable member.

With the telescopic apparatus according to the ninth aspect, it is possible to pull the movable member using deformation of the actuator.

In accordance with a tenth aspect of the present invention, the telescopic apparatus according to the ninth aspect is configured so that the second direction is parallel to the telescopic direction.

With the telescopic apparatus according to the tenth aspect, it is possible to make telescopic apparatus compact.

In accordance with an eleventh aspect of the present invention, the telescopic apparatus according to the ninth aspect is configured so that the actuator decreases in length in response to an increase in the stimulation to generate the pulling movement of the movable member.

With the telescopic apparatus according to the eleventh aspect, it is possible to release the pulling movement of the movable member using deformation of the actuator.

In accordance with a twelfth aspect of the present invention, the telescopic apparatus according to any one of the ninth to eleventh aspects is configured so that the actuator increases in length in response to a decrease in the stimulation to release the pulling movement of the movable member.

With the telescopic apparatus according to the twelfth aspect, it is possible to release the pulling movement of the movable member using deformation of the actuator.

In accordance with a thirteenth aspect of the present invention, the telescopic apparatus according to any one of the first to twelfth aspects is configured so that the actuator includes a piezoelectric element configured to change a shape of the piezoelectric element in response to the stimulation.

With the telescopic apparatus according to the thirteenth aspect, it is possible to simplify the structure of the telescopic apparatus.

In accordance with a fourteenth aspect of the present invention, the telescopic apparatus according to any one of the first to twelfth aspects is configured so that the actuator includes a shape-memory alloy configured to change a shape of the shape-memory alloy in response to the stimulation.

With the telescopic apparatus according to the fourteenth aspect, it is possible to simplify the structure of the telescopic apparatus.

In accordance with a fifteenth aspect of the present invention, the telescopic apparatus according to any one of the first to fourteenth aspects further comprises a hydraulic structure including a first hydraulic chamber, a second hydraulic chamber, and a passageway provided between the first hydraulic chamber and the second hydraulic chamber.

The movable member is movable relative to the hydraulic structure to change a state of the hydraulic structure between a closed state where the movable member closes the passageway and an open state where the movable member opens the passageway.

With the telescopic apparatus according to the fifteenth aspect, it is possible to change the state of the hydraulic structure using the movable member.

In accordance with a sixteenth aspect of the present invention, the telescopic apparatus according to any one of the first to fifteenth aspects is configured so that the actuator is coupled to the movable member to move the movable member from a closed position to an open position relative to the hydraulic structure in the telescopic direction. The hydraulic structure is in the closed state in a state where the movable member is in the closed position. The hydraulic structure is in the open state in a state where the movable member is in the open position.

With the telescopic apparatus according to the sixteenth aspect, it is possible to change the state of the hydraulic structure using the movable member and the actuator.

In accordance with a seventeenth aspect of the present invention, the telescopic apparatus according to any one of the first to sixteenth aspects further comprises an intermediate structure provided between the actuator and the movable member to convert a movement of the actuator in a first actuation direction to a second actuation direction in which the actuator moves the movable member relative to the first tube. The first actuation direction is opposite to the second actuation direction.

With the telescopic apparatus according to the seventeenth aspect, it is possible to move the movable member using the actuator and the intermediate structure when a direction of the movement of the actuator is different from a direction of the movement of the movable member.

In accordance with an eighteenth aspect of the present invention, the telescopic apparatus according to any one of the first to seventeenth aspects wherein, the telescopic apparatus includes a height adjustable seatpost assembly. The height adjustable seatpost assembly comprises the first tube, the second tube, the movable member, and the actuator.

With the telescopic apparatus according to the eighteenth aspect, it is possible to apply the actuator to the height adjustable seatpost assembly.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
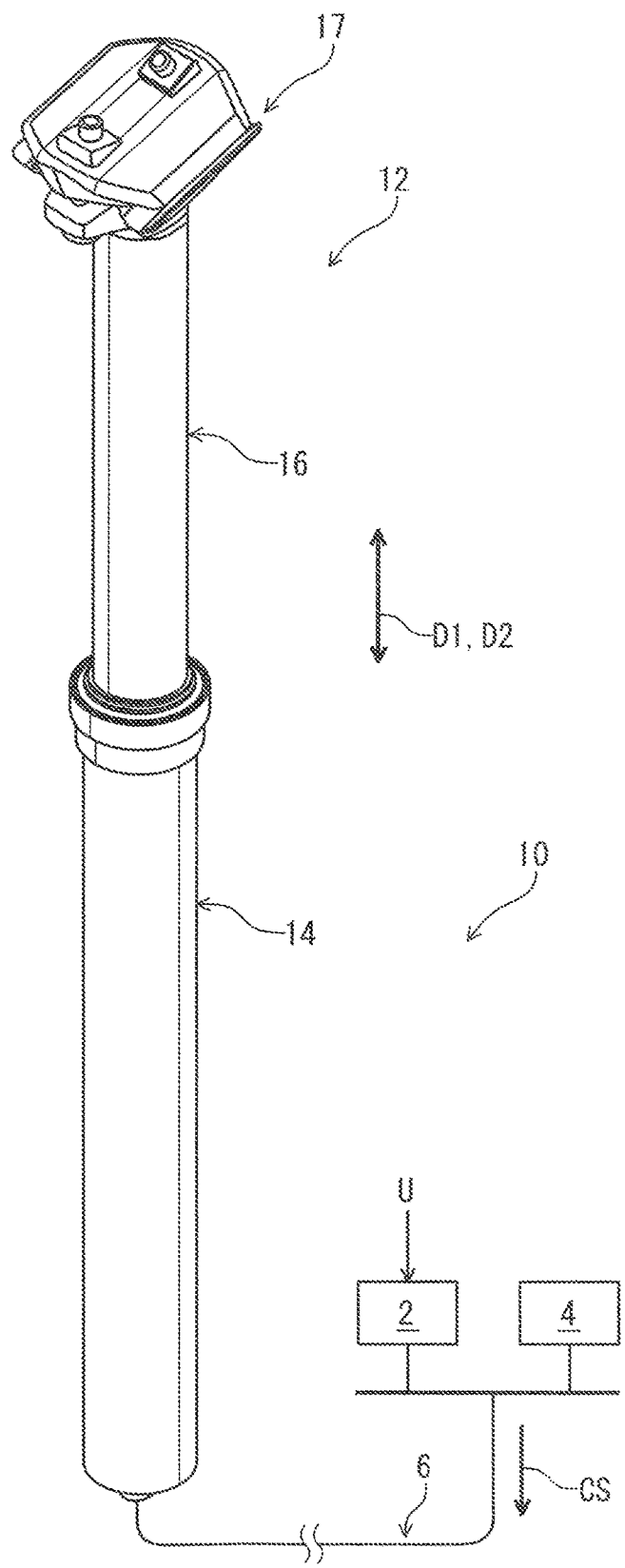
FIG. 1 is a perspective view of a telescopic apparatus in accordance with a first embodiment, with a schematic block diagram of a telescopic actuation system.

The embodiment(s) will now be described with reference to the accompanying drawings, wherein like reference numerals designate corresponding or identical elements throughout the various drawings.

First Embodiment

Referring initially to FIG. 1, a telescopic actuation system 10 includes a telescopic apparatus 12 in accordance with a first embodiment. The telescopic apparatus 12 comprises a first tube 14 and a second tube 16. The second tube 16 is telescopically and movably coupled to the first tube 14. The first tube 14 and the second tube 16 are movable relative to each other in a telescopic direction D1. The telescopic apparatus 12 further comprises a saddle mounting structure 17 to fixedly mount a saddle (not shown) to one of the first tube 14 and the second tube 16. In this embodiment, the saddle mounting structure 17 is attached to the second tube 16 to fixedly mount the saddle (not shown) to the second tube 16, However, the saddle mounting structure 17 can be attached to the first tube 14 to fixedly mount the saddle (not shown) to the first tube 14.

Figure 2:
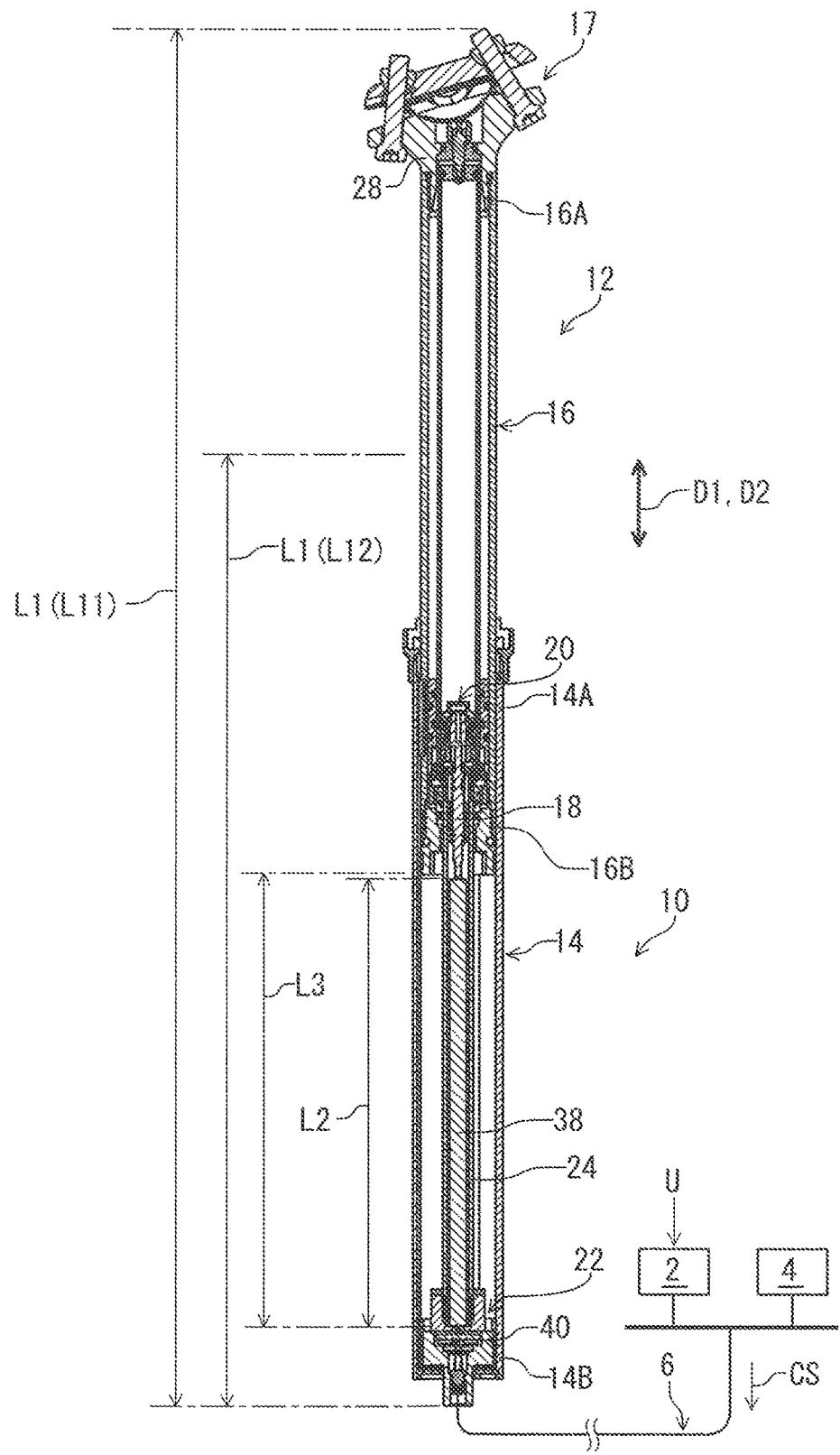
FIG. 2 is a cross-sectional view of the telescopic apparatus taken along line II-II of FIG. 1, with the schematic block diagram of the telescopic actuation system.

As seen in FIG. 2, the second tube 16 is telescopically coupled to the first tube 14 to vary a total length L1 of the telescopic apparatus 12. The telescopic apparatus 12 has a maximum total length L11 and a minimum total length L12. The first tube 14 includes a first end 14A and a first opposite end 14B. The first tube 14 extends between the first end 14A and the first opposite end 14B. The second tube 16 includes a second end 16A and a second opposite end 16B. The second tube 16 extends between the second end 16A and the second opposite end 16B. The second opposite end 16B is provided in the first tube 14. The first tube 14 is configured to be detachably attached to a seat tube of a bicycle frame (not shown). In this embodiment, the first end 14A is an upper end of the first tube 14 in a mounting state where the telescopic apparatus 12 is mounted to the seat tube. The second end 16A is an upper end of the second tube 16 in the mounting state of the telescopic apparatus 12.

In the present application, the following directional terms "forward", "rearward", "left", "right", "upward" and "downward" as well as any other similar directional terms refer to those directions which are determined on the basis of the rider who sits on a saddle (not shown) of a bicycle with facing a bicycle handlebar (not shown). Accordingly, these terms, as utilized to describe the telescopic apparatus 12, should be interpreted relative to a bicycle equipped with the telescopic apparatus 12 as used in an upright riding position on a horizontal surface.

Figure 3:
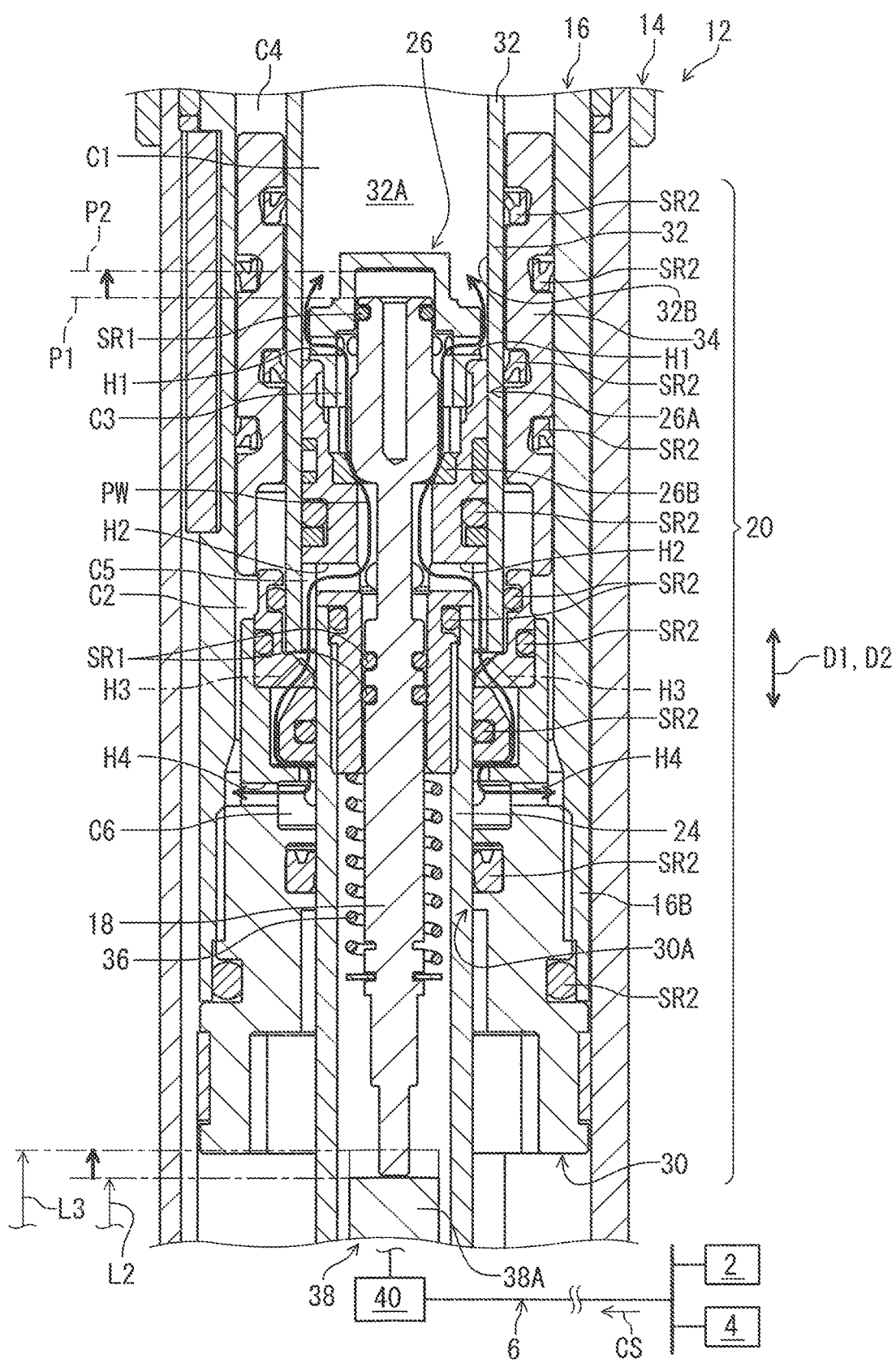
FIG. 3 is a partial cross-sectional view of the telescopic apparatus illustrated in FIG. 2.

As seen in FIG. 3, the telescopic apparatus 12 comprises a movable member 18 movable relative to the first tube 14 in the telescopic direction D1. The movable member 18 extends in the telescopic direction D1. In this embodiment, the telescopic apparatus 12 further comprises a hydraulic structure 20. The hydraulic structure 20 includes a first hydraulic chamber C1, a second hydraulic chamber C2, and a passageway PW. The passageway PW is provided between the first hydraulic chamber C1 and the second hydraulic chamber C2. The movable member 18 is movable relative to the hydraulic structure 20 to change a state of the hydraulic structure 20 between a closed state where the movable member 18 closes the passageway PW and an open state where the movable member 18 opens the passageway PW. The first hydraulic chamber C1 and the second hydraulic chamber C2 are filled with a substantially incompressible fluid (e.g., oil). The movable member 18 is movable relative to the hydraulic structure 20 between a closed position P1 and an open position P2 in the telescopic direction D1. The hydraulic structure 20 is in the closed state in a state where the movable member 18 is in the closed position P1. The hydraulic structure 20 is in the open state in a state where the movable member 18 is in the open position P2.

Figure 4:
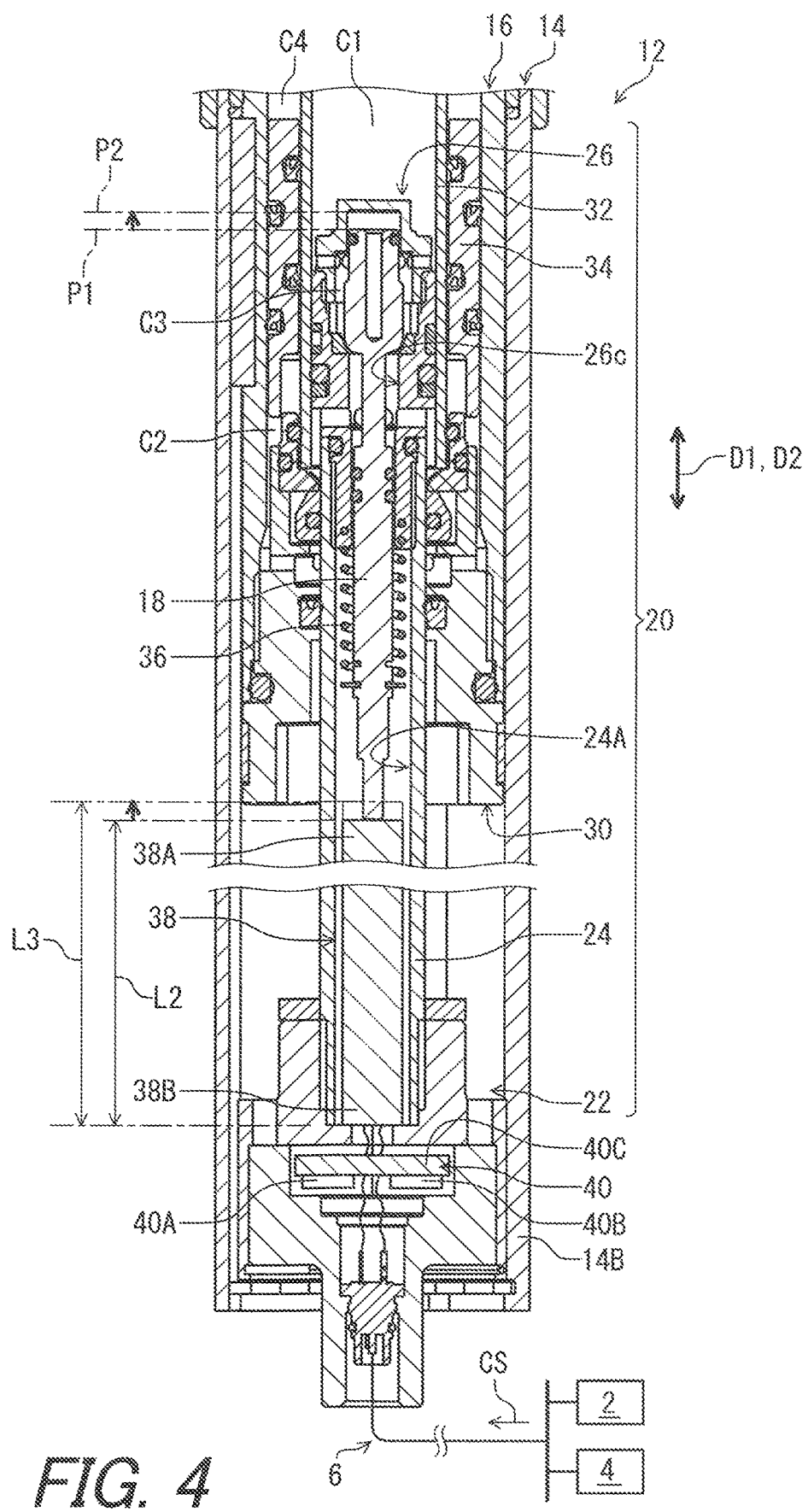
FIG. 4 is a partial cross-sectional view of the telescopic apparatus illustrated in FIG. 2.

As seen in FIG. 4, the hydraulic structure 20 includes a first support 22, a first inner tube 24, and a valve body 26. The first support 22 is secured to the first opposite end 14B of the first tube 14. The first inner tube 24 is secured to the first support 22 and provided in the first tube 14. The first inner tube 24 extends from the first support 22 in the telescopic direction D1. The valve body 26 is secured to an end of the first inner tube 24. The valve body 26 includes an internal cavity 26C. The first inner tube 24 includes a cavity 24A. The movable member 18 is movably provided in the internal cavity 26C and the cavity 24A. The movable member 18 and the valve body 26 define a valve chamber C3 in the internal cavity 26C.

Figure 5:
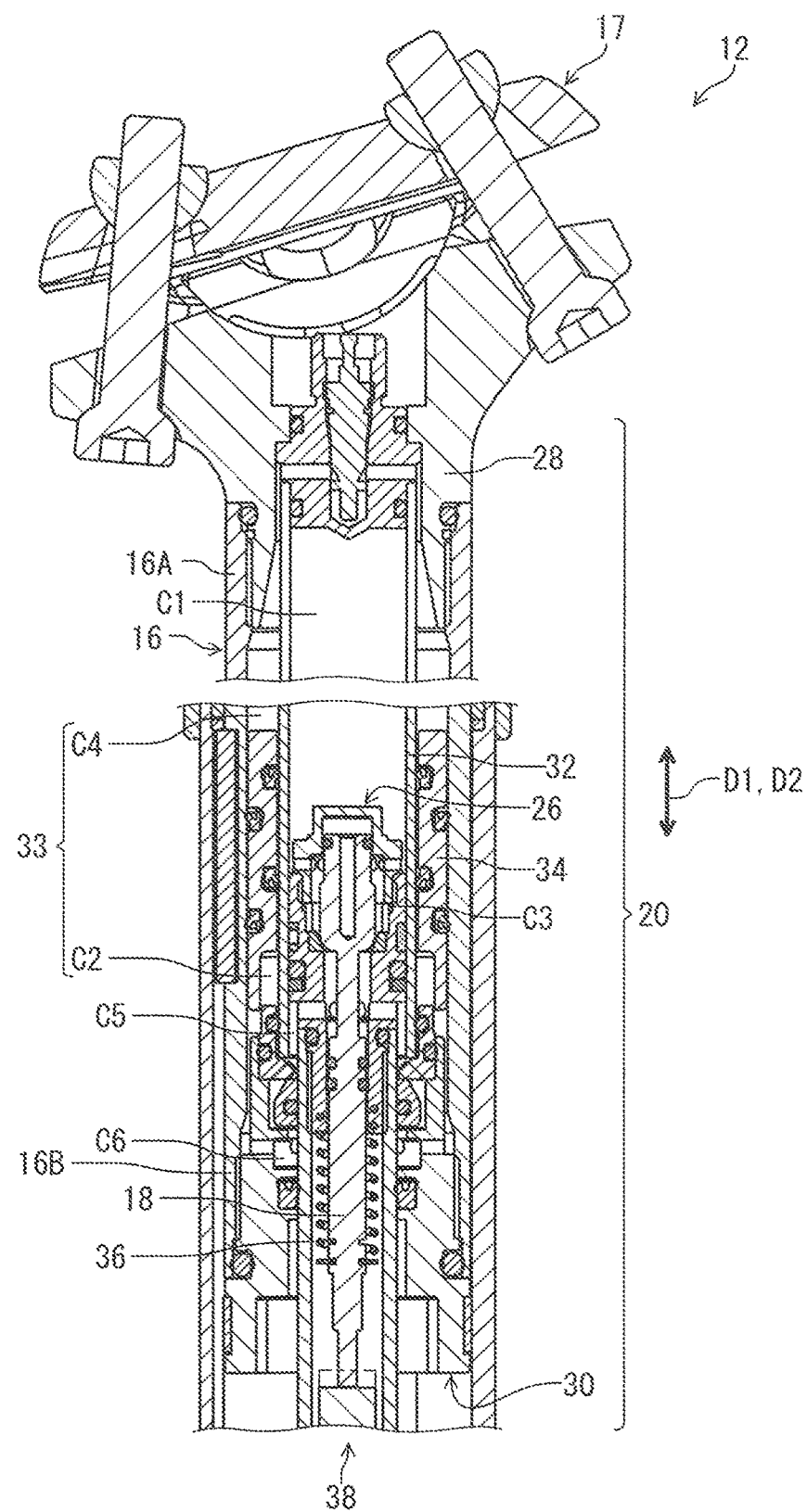
FIG. 5 is a partial cross-sectional view of the telescopic apparatus illustrated in FIG. 2.

As seen in FIG. 5, the hydraulic structure 20 includes a second support 28, an intermediate support 30, and a second inner tube 32. The second support 28 is secured to the second end 16A of the second tube 16. The second support 28 is integrally provided with the saddle mounting structure 17 and couples the saddle mounting structure 17 to the second tube 16. The intermediate support 30 is secured to the second opposite end 16B of the second tube 16. The second inner tube 32 is provided in the second tube 16 and disposed between the second support 28 and the intermediate support 30. The second support 28 and the intermediate support 30 are secured to the second tube 16 to hold the second inner tube 32 in the second tube 16. The second tube 16, the second inner tube 32, the second support 28, and the intermediate support 30 define an internal space 33.

The hydraulic structure 20 includes a floating piston 34. The floating piston 34 is movably provided in the internal space 33 to divide the internal space 33 into the second hydraulic chamber C2 and a biasing chamber C4. The biasing chamber C4 is filled with a compressible fluid (e.g., gas such as air) to produce biasing force to lengthen the telescopic apparatus 12. The compressible fluid is compressed in the biasing chamber C4 to produce the biasing force in a state where the total length L1 of the telescopic apparatus 12 is the maximum total length L11 (FIG. 2).

As seen in FIG. 3, the intermediate support 30 includes a support opening 30A. The first inner tube 24 extend through the support opening 30A. The valve body 26 is movably provided in a cavity 32A of the second inner tube 32. The valve body 26 is in slidable contact with an inner peripheral surface 32B of the second inner tube 32. As seen in FIG. 5, the valve body 26, the second inner tube 32, and the second support 28 define the first hydraulic chamber C1 in the second inner tube 32.

As seen in FIG. 3, the first inner tube 24, the valve body 26, the second inner tube 32, and the intermediate support 30 define a first intermediate chamber C5 and a second intermediate chamber C6. The valve body 26 includes a plurality of first holes H1 and a plurality of second holes H2. The plurality of first holes H1 connects the first hydraulic chamber C1 to the valve chamber C3. The plurality of second holes H2 connects the valve chamber C3 to the first intermediate chamber C5. The intermediate support 30 includes a plurality of third holes H3 and a plurality of fourth holes H4. The plurality of third holes H3 connects the first intermediate chamber C5 to the second intermediate chamber C6. The plurality of fourth holes H4 connects the second intermediate chamber C6 to the second hydraulic chamber C2. The passageway PW includes the plurality of first holes H1, the valve chamber C3, the plurality of second holes H2, the first intermediate chamber C5, the plurality of third holes H3, the second intermediate chamber C6, and the plurality of fourth holes H4.

The valve body 26 includes a base member 26A and a valve seat 26B. The base member 26A includes the plurality of first holes H1 and the plurality of second holes H2. The valve seat 26B is attached to the base member 26A to be contactable with the movable member 18. The movable member 18 is in contact with the valve seat 26B to close the passageway PW in the closed state where the movable member 18 is in the closed position P1. The movable member 18 is spaced apart from the valve seat 26B to open the passageway PW in the open state where the movable member 18 is in the open position P2.

The telescopic apparatus 12 comprises a biasing member 36 to bias the movable member 18 toward the closed position P1. The biasing member 36 is provided in the first inner tube 24. For example, the biasing member 36 includes a spring. The movable member 18 includes a plurality of seal rings SR1. The hydraulic structure 20 includes a plurality of seal rings SR2.

The substantially incompressible fluid does not flow between the first hydraulic chamber C1 and the second hydraulic chamber C2 in the closed state where the movable member 18 closes the passageway PW. Thus, in the closed state, the first tube 14 and the second tube 16 are fixedly positioned relative to each other in the telescopic direction D1.

The substantially incompressible fluid can flow between the first hydraulic chamber C1 and the second hydraulic chamber C2 through the passageway PW in the open state where the movable member 18 opens the passageway PW. For example, when the rider's weight is applied to the second tube 16 in the open state, the substantially incompressible fluid flows from the first hydraulic chamber C1 to the second hydraulic chamber C2 through the passageway PW. Thus, the floating piston 34 is pressed toward the biasing chamber C4 relative to the first tube 14, increasing a volume of the second hydraulic chamber C2 while the compressible fluid is compressed in the biasing chamber C4. This downwardly moves the second tube 16 relative to the first tube 14 against the basing force of the biasing chamber C4 while the rider's weight is applied to the second tube 16, allowing the rider to lower the saddle using the rider's weight in the open state.

The compressible fluid compressed in the biasing chamber C4 biases the second tube 16 to upwardly move relative to the first tube 14 in the telescopic direction D1 and to downwardly move the floating piston 34 in the telescopic direction D1. When the rider's weight is released from the second tube 16 in the open state, the substantially incompressible fluid flows from the second hydraulic chamber C2 to the first hydraulic chamber C1 through the passageway PW because of the biasing force of the biasing chamber C4. This upwardly moves the second tube 16 relative to the first tube 14 while the rider's weight is released from the second tube 16, allowing the rider to lift the saddle by releasing the rider's weight in the open state.

As seen in FIG. 2, the telescopic apparatus 12 comprises an actuator 38 configured to be deformable so as to move the movable member 18 relative to the first tube 14 in the telescopic direction D1. The actuator 38 is provided in at least one of the first tube 14 and the second tube 16. The actuator 38 is entirely provided in the at least one of the first tube 14 and the second tube 16. The actuator 38 has an elongated shape in the telescopic direction D1. In this embodiment, the actuator 38 is entirely provided in the first tube 14 in a state where the total length L1 of the telescopic apparatus 12 is the maximum total length L11. The actuator 38 is entirely provided in the first tube 14 and partly provided in the second tube 16 in a state where the total length of the telescopic apparatus 12 is the minimum total length L12. The actuator 38 is provided in the first inner tube 24. However, the position of the actuator 38 is not limited to this embodiment.

As seen in FIG. 4, the actuator 38 is coupled to the movable member 18 to move the movable member 18 from the closed position P1 to the open position P2 relative to the hydraulic structure 20 in the telescopic direction D1. The actuator 38 includes a first actuation end 38A and a second actuation end 38B. The actuator 38 extends between the first actuation end 38A and the second actuation end 38B. The first actuation end 38A is coupled to the movable member 18. The second actuation end 38B is in contact with the first support 22 because of the biasing member 36 in a state where the movable member 18 is in contact with the valve seat 26B. The second actuation end 38B can be secured to the first support 22.

The actuator 38 is configured to deform in accordance with stimulation including at least one of electric charge, heat, and biasing force. The actuator 38 is configured to extend in a first direction D2 in accordance with the stimulation to generate a pushing movement of the movable member 18. The actuator 38 increases in length in response to an increase in the stimulation to generate the pushing movement of the movable member 18. The actuator 38 decreases in length in response to a decrease in the stimulation to release the pushing movement of the movable member 18. The first direction D2 is parallel to the telescopic direction D1. However, the first direction D2 can be non-parallel to the telescopic direction D1.

In this embodiment, the actuator 38 is configured to deform in accordance with the stimulation including electric charge and biasing force. For example, the electric charge of the stimulation includes at least one of voltage and current (physical amount relating to the electric charge). The biasing force of the stimulation can include at least one of the biasing force of the biasing member 36, pressure, mechanical stress, and other force which are applied to the actuator 38.

The actuator 38 is configured to extend in the first direction D2 in accordance with the electric charge to generate the pushing movement of the movable member 18. The actuator 38 is configured to shrink in the first direction D2 in accordance with the electric charge to release the pushing movement of the movable member 18 (or to pull the movable member 18). Specifically, the actuator 38 increases in length in response to the increase in the electric charge to generate the pushing movement of the movable member 18. The actuator 38 decreases in length in response to the decrease in the electric charge to release the pushing movement of the movable member 18 (or to pull the movable member 18). Namely, the actuator 38 pushes the movable member 18 from the closed position P1 to the open position P2 in response to the increase in the stimulation (e.g., an amount of electric charge). The actuator 38 releases the pushing movement (or pulls the movable member 18) to move the movable member 18 from the open position P2 to the closed position P1 in response to the decrease in the stimulation (e.g., an amount of electric charge).

In this embodiment, the actuator 38 includes a piezoelectric element configured to change a shape of the piezoelectric element in response to the stimulation. For example, the piezoelectric element is configured to change a shape of the piezoelectric element in response to the electric charge. The actuator 38 includes an electrical insulator covering the piezoelectric element. The actuator 38 can include another element to change a shape thereof instead of or in addition to the piezoelectric element.

Figure 6:
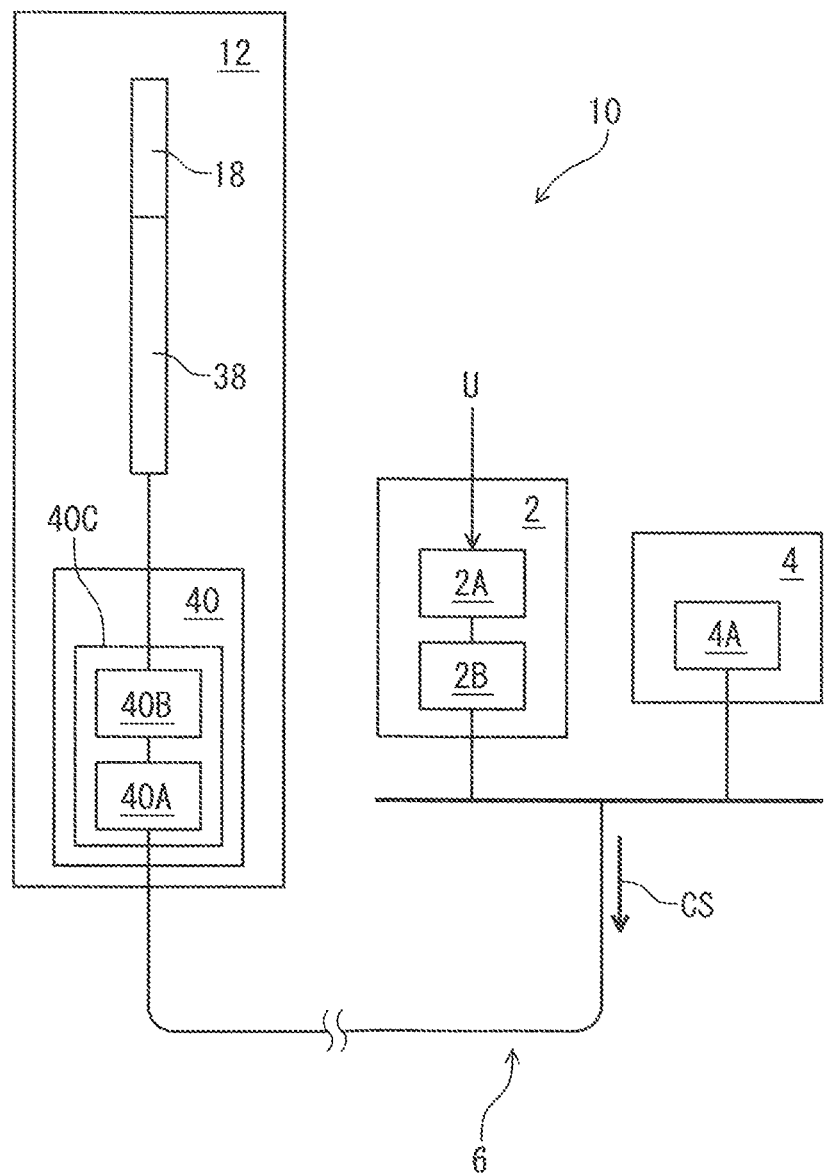
FIG. 6 is a schematic block diagram of the telescopic actuation system illustrated in FIG. 1.

As seen in FIG. 6, the telescopic actuation system 10 includes an operating device 2 and an electric power source 4. The operating device 2 includes an electrical switch 2A configured to receive a user input U to generate a control signal CS. In this embodiment, the electrical switch 2A is configured to generate the control signal CS having a signal length corresponding to a time for which the rider keeps pushing the electrical switch 2A. Thus, the electrical switch 2A keeps generating the control signal CS while the rider pushes the electrical switch 2A. For example, the operating device 2 is provided at a position (e.g., a handlebar) where the rider can access the operating device 2. The electric power source 4 is mounted on a bicycle frame (not shown). For example, the electric power source 4 includes a battery 4A. However, the electric power source 4 can include other components instead of or in addition to the battery 4A.

The telescopic apparatus 12 comprises an actuation controller 40 electrically connected to the actuator 38, the operating device 2, and the electric power source 4 to control the stimulation in response to the control signal CS. The actuation controller 40 is configured to control voltage and/or current (physical amount relating to the electric charge) applied from the electric power source 4 to the actuator 38 in response to the control signal CS. In this embodiment, the actuation controller 40 is electrically connected to the operating device 2 and the electric power source 4 with an electric communication path 6. The electric communication path 6 includes a ground line and a voltage line. Electricity is supplied from the electric power source 4 to the operating device 2 and the actuation controller 40 via the voltage line of the electric communication path 6. In this embodiment, the actuation controller 40, the operating device 2, and the electric power source 4 are configured to communicate with each other through the voltage line using the power line communication technology.

The power line communication (PLC) uses unique identifying information such as a unique identifier that is assigned to each of the operating device 2 and the actuation controller 40. Each of the operating device 2 and the actuation controller 40 includes a PLC controller in which the unique identifying information is stored. Based on the unique identifying information, each of the operating device 2 and the actuation controller 40 can recognize control signals which are necessary for itself among control signals transmitted via the electric communication path 6. For example, the actuation controller 40 can recognize the control signal transmitted from the operating device 2 via the electric communication path 6. Instead of using the PLC technology, however, separate signal wires can be provided for transmitting data in addition to the ground wire and the voltage wire if needed and/or desired. Furthermore, wireless technology can be used to transmit the control signal CS between the operating device 2 and the actuation controller 40.

The operating device 2 includes a PLC controller 2B connected to the electrical switch 2A. The actuation controller 40 includes a PLC controller 40A electrically connected to the PLC controller 2B of the operating device 2 with the electric communication path 6. The PLC controller 2B is configured to superimpose the control signal CS on a power source voltage applied to the actuation controller 40 from the electric power source 4. The PLC controller 40A is configured to separate input signals to the power source voltage and the control signal CS. The PLC controller 40A is configured to regulate the power source voltage to a level at which the PLC controller 40A can properly operate.

The actuation controller 40 controls the stimulation (e.g., an amount of electric charge) at an initial level (e.g., zero) while the actuation controller 40 does not receive the control signal CS from the operating device 2. The actuation controller 40 increases the stimulation (e.g., the amount of electric charge) from the initial level to a predetermined actuation level which is higher than the initial level while the actuation controller 40 receives the control signal CS from the operating device 2.

In this embodiment, the actuation controller 40 includes a boost converter 40B and a circuit board 40C. The PLC controller 40A and the boost converter 40B are electrically mounted on the circuit board 40C. The PLC controller 40A is electrically connected to the boost converter 40B with an electrical conductor of the circuit board 40C. As seen in FIG. 4, the circuit board 40C is secured to the first support 22.

As seen in FIG. 6, the boost converter 40B is configured to increase the voltage applied from the electric power source 4 to the actuator 38 to the predetermined actuation level in response to the control signal CS. For example, the boost converter 40B is a DC-DC boost converter. The boost converter 40B controls the voltage at the initial level while the actuation controller 40 does not receive the control signal CS from the operating device 2. The boost converter 40B increases the voltage to the predetermined actuation level while the actuation controller 40 receives the control signal CS from the operating device 2. The boost converter 40B decreases the voltage to the initial level in response to termination of the control signal CS.

As seen in FIG. 2, the actuator 38 has an initial length L2 when the stimulation is at the initial level. The actuator 38 has a length L3 when the stimulation is at the predetermined actuation level. The length L3 of the actuator 38 is longer than the initial length L2 of the actuator 38.

As seen in FIG. 3, the initial length L2 of the actuator 38 corresponds to the closed position P1 of the movable member 18. The length L3 of the actuator 38 corresponds to the open position P2 of the movable member 18.

The actuator 38 increases in length in response to the increase in the stimulation (e.g., electric charge) to generate the pushing movement of the movable member 18 while the actuation controller 40 receives the control signal CS from the operating device 2. The length of the actuator 38 changes from the initial length L2 to the length L3 while the actuation controller 40 receives the control signal CS from the operating device 2. Thus, the actuator 38 moves the movable member 18 from the closed position P1 to the open position P2 while the actuation controller 40 receives the control signal CS from the operating device 2. This changes the state of the hydraulic structure 20 from the closed state to the open state, allowing the rider to adjust the height of the saddle using the rider's weight while the rider operates the operating device 2.

The actuator 38 decreases in length in response to the decrease in the stimulation (e.g., electric charge) to release the pushing movement of the movable member 18 while the actuation controller 40 does not receive the control signal CS from the operating device 2. Furthermore, the actuator 38 decreases in length in response to the stimulation (e.g., the biasing force of the biasing member 236) in addition to electric charge to release the pushing movement of the movable member 18 while the actuation controller 40 does not receive the control signal CS from the operating device 2. The length of the actuator 38 changes from the length L3 to the initial length L2 while the actuation controller 40 does not receive the control signal CS from the operating device 2. Thus, the actuator 38 moves the movable member 18 from the open position P2 to the closed position P1 in response to termination of the control signal CS. This changes the state of the hydraulic structure 20 from the open state to the closed state, maintaining the height of the saddle at an adjusted position while the rider does not operate the operating device 2.

Second Embodiment

A telescopic apparatus 212 in accordance with a second embodiment will be described below referring to FIGS. 7 and 8. The telescopic apparatus 212 has the same structure and/or configuration as those of the telescopic apparatus 12 except for the movable member 18 and the hydraulic structure 20. Thus, elements having substantially the same function as those in the first embodiment will be numbered the same here and will not be described and/or illustrated again in detail here for the sake of brevity.

Figure 7:
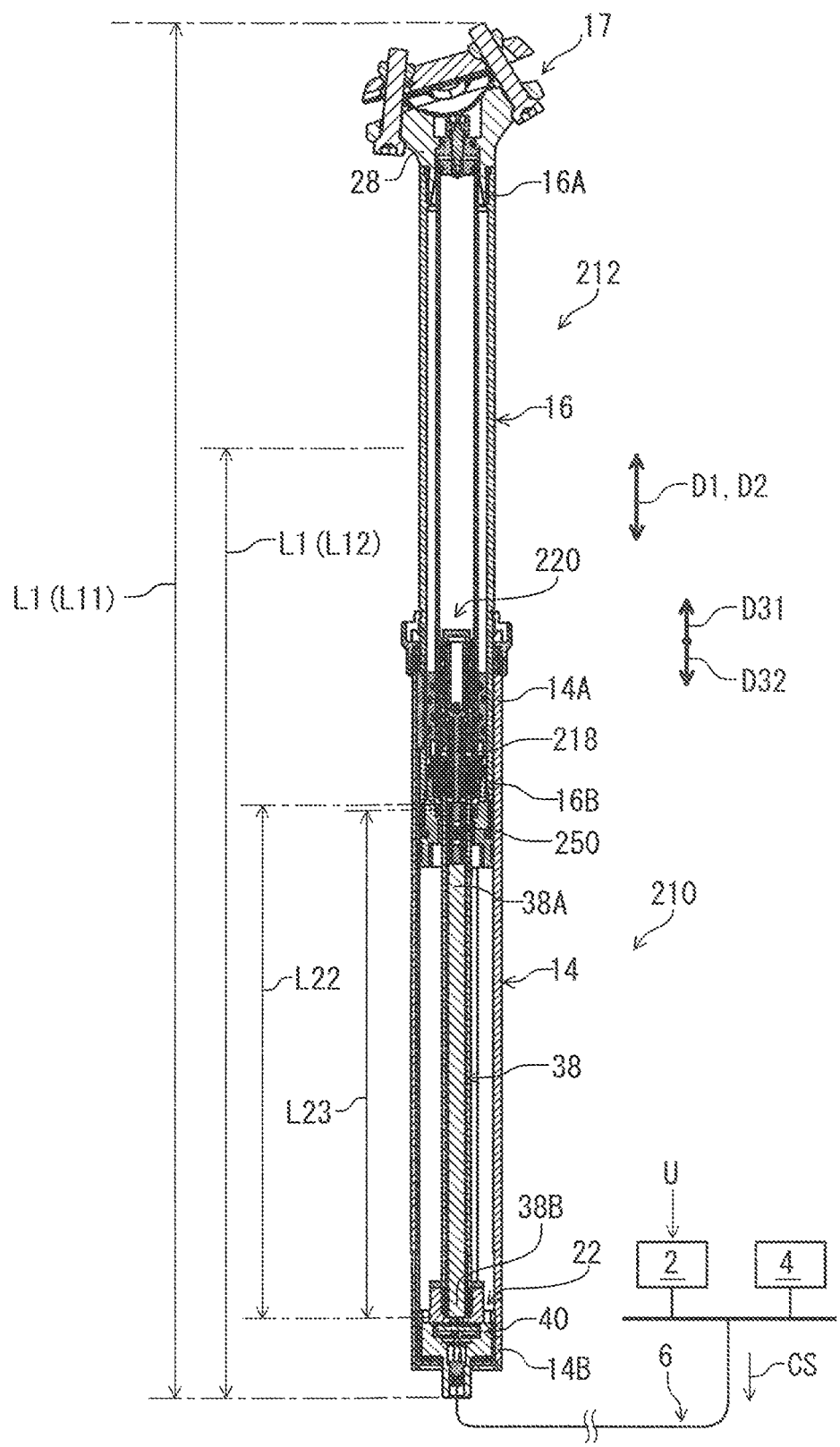
FIG. 7 is a cross-sectional view of a telescopic apparatus in accordance with a second embodiment, with a schematic block diagram of a telescopic actuation system.

As seen in FIG. 7, a telescopic actuation system 210 includes the telescopic apparatus 212, the operating device 2, and the electric power source 4. The telescopic apparatus 212 comprises the first tube 14, the second tube 16, a movable member 218, and the actuator 38. The telescopic apparatus 12 further comprises a hydraulic structure 220. The movable member 218 has substantially the same structure as that of the movable member 18 of the first embodiment. The hydraulic structure 220 has substantially the same structure as that of the hydraulic structure 20 of the first embodiment.

Figure 8:
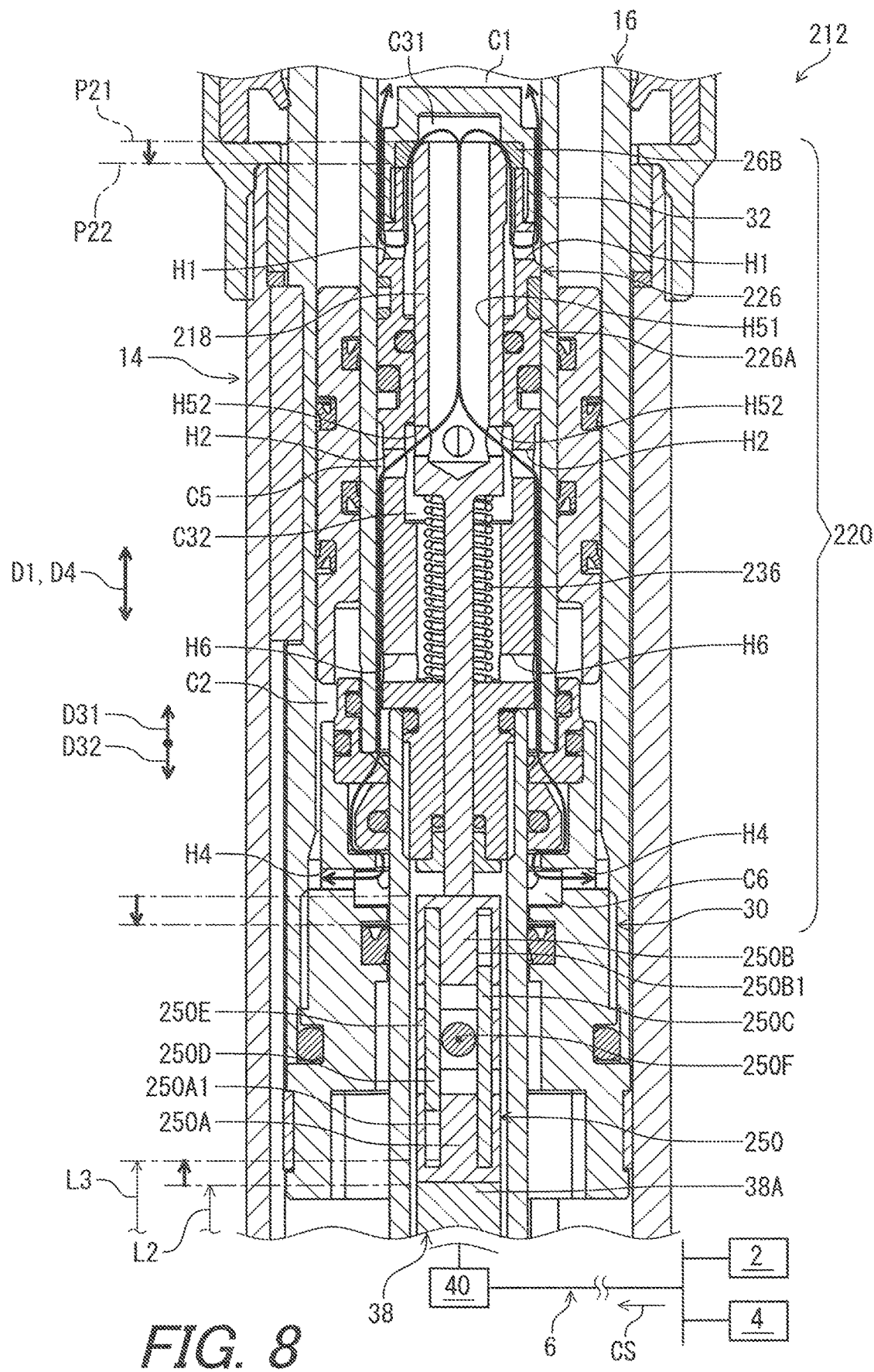
FIG. 8 is a partial cross-sectional view of the telescopic apparatus illustrated in FIG. 7.

As seen in FIG. 8, the movable member 218 is movable relative to the hydraulic structure 220 to change a state of the hydraulic structure 220 between a closed state where the movable member 218 closes the passageway PW and an open state where the movable member 218 opens the passageway PW. The movable member 218 is movable relative to the hydraulic structure 220 between a closed position P21 and an open position P22 in the telescopic direction D1. The actuator 38 is coupled to the movable member 218 to move the movable member 218 from the closed position P21 to the open position P22 relative to the hydraulic structure 220 in the telescopic direction D1. The hydraulic structure 20 is in the closed state in a state where the movable member 218 is in the closed position P21. The hydraulic structure 20 is in the open state in a state where the movable member 218 is in the open position P22.

In this embodiment, the actuator 38 pushes the movable member 218 from the open position P22 to the closed position P21 in response to the increase in the stimulation (e.g., electric charge). The actuator 38 releases the pushing movement (or pulls the movable member 218) to move the movable member 218 from the closed position P21 to the open position P22 in response to the decrease in the stimulation (e.g., electric charge). Furthermore, the actuator 38 releases the pushing movement (or pulls the movable member 218) to move the movable member 218 from the closed position P21 to the open position P22 in response to the stimulation (e.g., biasing force) in addition to electric charge.

As seen in FIG. 8, the hydraulic structure 220 includes a valve body 226. The valve body 226 includes a first valve chamber C31 and a second valve chamber C32 which are separate from each other. The movable member 18 and the valve body 226 define the first valve chamber C31 and the second valve chamber C32. The second valve chamber C32 is connected to the cavity 24A of the first inner tube 24. The movable member 218 is movably provided in the first valve chamber C31 and the second valve chamber C32.

The movable member 218 includes a first connection hole H51 and a plurality of second connection holes H52 connected to the first connection hole H51. The first connection hole H51 and the plurality of second connection holes H52 connect the first valve chamber C31 to the second valve chamber C32. The plurality of first holes H1 connects the first hydraulic chamber C1 to the first valve chamber C31. The plurality of second holes H2 connects the second valve chamber C32 to the first intermediate chamber C5. The passageway PW includes the plurality of first holes H1, the first valve chamber C31, the first connection hole H51, the plurality of second connection holes H52, the second valve chamber C32, the plurality of second holes H2, the first intermediate chamber C5, the plurality of third holes H3, the second intermediate chamber C6, and the plurality of fourth holes H4.

The valve body 226 includes a base member 226A and the valve seat 26B. The position of the valve seat 26B in this embodiment is different from the position of the valve seat 26B in the first embodiment. The valve seat 26B is attached to the base member 226A to be contactable with the movable member 218. The movable member 218 is in contact with the valve seat 26B to close the passageway PW in a state where the movable member 218 is in the closed position P21. The movable member 218 is spaced apart from the valve seat 26B to open the passageway PW in a state where the movable member 218 is in the open position P22. The base member 226A includes a plurality of fifth holes H6 connecting the second valve chamber C32 to the second intermediate chamber C6.

The telescopic apparatus 12 comprises a biasing member 236 to bias the movable member 18 toward the closed position P21. The biasing member 236 has substantially the same structure as that of the biasing member 36. In this embodiment, the biasing member 236 is provided in the second valve chamber C32 to bias the movable member 218 away from the actuator 38. For example, the biasing member 236 includes a spring.

As seen in FIG. 8, the telescopic apparatus 212 further comprises an intermediate structure 250. The intermediate structure 250 is provided between the actuator 38 and the movable member 218 to convert a movement of the actuator 38 in a first actuation direction D31 to a second actuation direction D32 in which the actuator 38 moves the movable member 218 relative to the first tube 14. The first actuation direction D31 is opposite to the second actuation direction D32. In this embodiment, the intermediate structure 250 is provided in the first inner tube 24. However, the intermediate structure 250 can be provided at other positions.

The intermediate structure 250 includes a first guide 250A, a second guide 250B, a first rack gear 250C, a second rack gear 250D, a gear support 250E, and a pinion gear 250F. The first guide 250A is secured to the actuator 38. The first guide 250A is movably provided in the first inner tube 24. The second guide 250B is secured to the movable member 218. The second guide 250B is movably provided in the first inner tube 24. The first rack gear 250B is secured to the first guide 250A. The second rack gear 250C is secured to the second guide 250B.

The first guide 250A includes a first guide hole 250A1. The second rack gear 250D is movably provided in the first guide hole 250A1. The second guide 250B includes a second guide hole 250B1. The first rack gear 250C is movably provided in the second guide hole 250B1. The gear support 250E is movably attached to the first rack gear 250C and the second rack gear 250D. The pinion gear 250F is rotatably attached to the gear support 250E. The pinion gear 250F meshes with the first rack gear 250C and the second rack gear 250D.

The actuator 38 increases in length in response to the increase in the stimulation (e.g., electric charge) to generate the pushing movement of the movable member 218 while the actuation controller 40 receives the control signal CS from the operating device 2. The actuator 38 moves the first guide 250A and the first rack gear 250C in the first actuation direction D31 relative to the first tube 14, rotating the pinion gear 250F. The rotation of the pinion gear 250F moves the second guide 250B, the second rack gear 250D, and the movable member 218 in the second actuation direction D32 relative to the first tube 14 against the biasing force of the biasing member 236. Thus, the actuator 38 moves the movable member 218 from the closed position P21 to the open position P22 while the rider operates the operating device 2.

The actuator 38 decreases in length in response to the decrease in the stimulation (e.g., electric charge) to release the pushing movement of the movable member 218 while the actuation controller 40 does not receive the control signal CS from the operating device 2. The biasing member 236 moves the movable member 218, the second guide 250B, and the second rack gear 250D in the first actuation direction D31 relative to the first tube 14. This rotates the pinion gear 250F, moving the first guide 250A and the first rack gear 250C in the second actuation direction D32 relative to the first tube 14. Namely, the actuator 38 decreases in length in response to the stimulation (e.g., the biasing force of the biasing member 236) in addition to electric charge and heat to release the pushing movement of the movable member 218 while the actuation controller 40 does not receive the control signal CS from the operating device 2. Thus, the actuator 38 moves the movable member 218 from the open position P22 to the closed position P21 in response to termination of the control signal CS.

Third Embodiment

A telescopic apparatus 312 in accordance with a third embodiment will be described below referring to FIGS. 9 to 11. The telescopic apparatus 312 has the same structure and/or configuration as those of the telescopic apparatus 212 except for the actuator. Thus, elements having substantially the same function as those in the above embodiments will be numbered the same here and will not be described and/or illustrated again in detail here for the sake of brevity.

Figure 9:
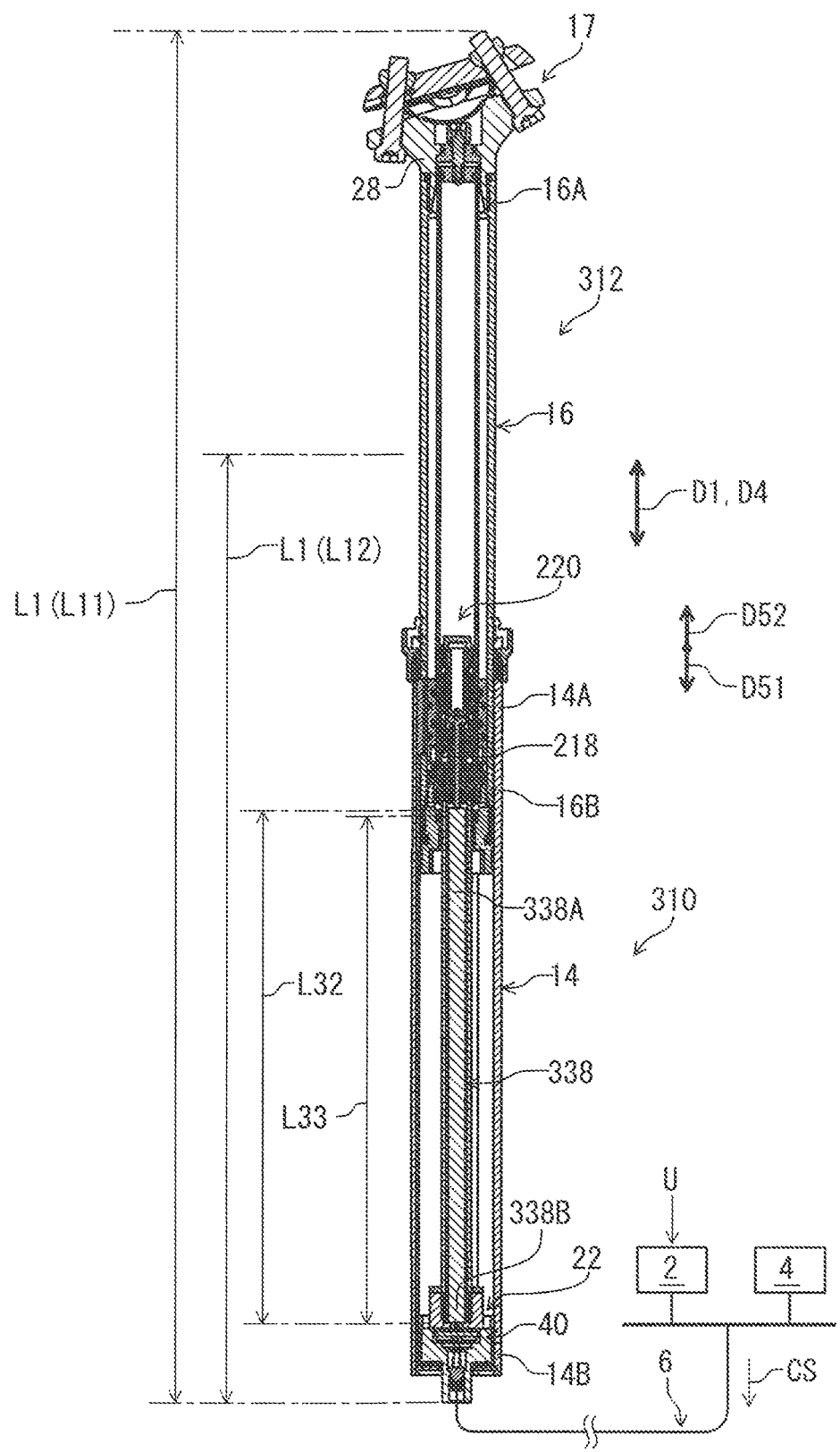
FIG. 9 is a cross-sectional view of a telescopic apparatus in accordance with a third embodiment, with a schematic block diagram of a telescopic actuation system.

As seen in FIG. 9, in a telescopic actuation system 310 includes the telescopic apparatus 312, the operating device 2, and the electric power source 4. The telescopic apparatus 312 comprises the first tube 14, the second tube 16, the movable member 218, and an actuator 338. The telescopic apparatus 312 further comprises the hydraulic structure 220. The actuator 338 is configured to be deformable so as to move the movable member 218 relative to the first tube 14 in the telescopic direction D1. The actuator 338 is provided in at least one of the first tube 14 and the second tube 16. The actuator 338 is entirely provided in the at least one of the first tube 14 and the second tube 16. The actuator 338 has an elongated shape in the telescopic direction D1. In this embodiment, the actuator 338 is entirely provided in the first tube 14 in a state where the total length L1 of the telescopic apparatus 12 is the maximum total length L11. The actuator 338 is entirely provided in the first tube 14 and partly provided in the second tube 16 in a state where the total length L1 of the telescopic apparatus 12 is the minimum total length L12. The actuator 338 is provided in the first inner tube 24. However, the position of the actuator 338 is not limited to this embodiment.

Figure 10:
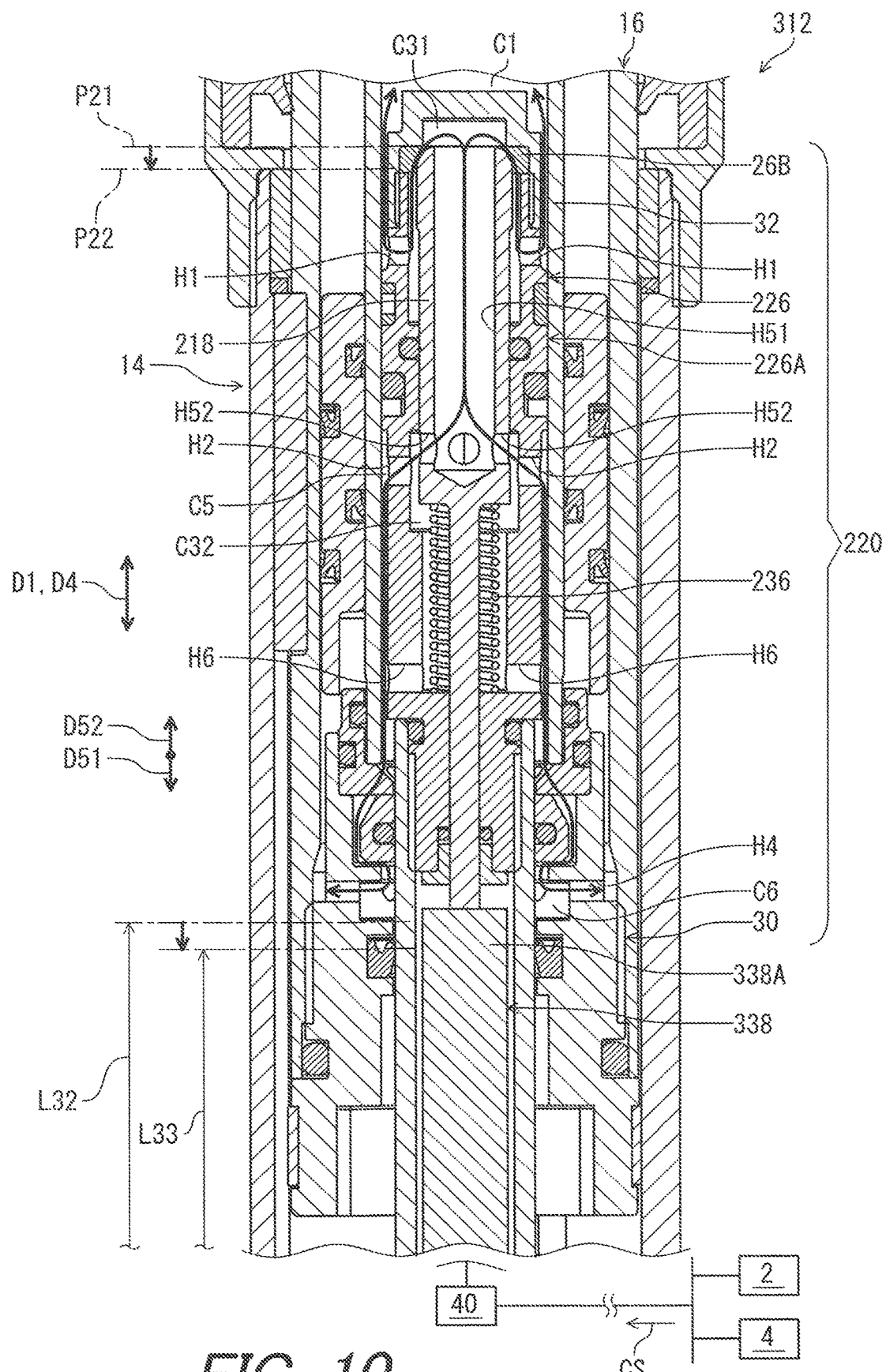
FIG. 10 is a partial cross-sectional view of the telescopic apparatus illustrated in FIG. 9.

As seen in FIG. 10, the actuator 338 is coupled to the movable member 218 to move the movable member 218 from the closed position P21 to the open position P22 relative to the hydraulic structure 20 in the telescopic direction D1. The actuator 338 includes a first actuation end 338A and a second actuation end 338B. The actuator 338 extends between the first actuation end 338A and the second actuation end 338B. The first actuation end 338A is coupled to the movable member 218. The second actuation end 338B is coupled to the first support 22.

The actuator 338 is configured to deform in accordance with stimulation including at least one of electric charge, heat, and biasing force. The actuator 338 is configured to shrink in a second direction D4 in accordance with the stimulation to generate a pulling movement of the movable member 218. The actuator 338 decreases in length in response to an increase in the stimulation to generate the pulling movement of the movable member 218. The actuator 338 increases in length in response to a decrease in the stimulation to release the pulling movement of the movable member 218. The second direction D4 is parallel to the telescopic direction D1. However, the second direction D4 can be non-parallel to the telescopic direction D1.

In this embodiment, the actuator 338 is configured to deform in accordance with the stimulation including electric charge, heat, and biasing force. For example, the electric charge of the stimulation includes at least one of voltage and current (physical amount relating to the electric charge). The biasing force of the stimulation can include at least one of the biasing force of the biasing member 236, pressure, mechanical stress, and other force which are applied to the actuator 338.

The actuator 338 is configured to shrink in the second direction D4 in accordance with electric charge and heat to generate the pulling movement. The actuator 338 decreases in length in response to the increase in electric charge and heat to generate the pulling movement of the movable member 218. The actuator 338 increases in length in response to the decrease in electric charge and heat to release the pulling movement of the movable member 218. Furthermore, the actuator 338 increases in length in response to the biasing force (e.g., the biasing force of the biasing member 236) to release the pulling movement of the movable member 218. Namely, the actuator 338 pulls the movable member 218 from the closed position P21 to the open position P22 in response to the increase in the stimulation (e.g., electric charge and heat). The actuator 338 releases the pulling movement to move the movable member 218 from the open position P22 to the closed position P21 in response to the decrease in the stimulation (e.g., electric charge and heat). The actuator 338 releases the pulling movement to move the movable member 218 from the open position P22 to the closed position P21 in response to the biasing force (e.g., the biasing force of the biasing member 236).

In this embodiment, the actuator 338 includes a shape-memory alloy configured to change a shape of the shape-memory alloy in response to the stimulation. For example, the shape-memory alloy is configured to change a shape of the shape-memory alloy in response to heat. Specifically, applying electric charge to the shape-memory alloy causes the shape-memory alloy to generate heat, increasing a temperature of the shape-memory alloy. Thus, the shape-memory alloy changes the shape of the shape-memory alloy in response to heat caused by the electric charge flowing through the shape-memory alloy. The actuator 338 includes an electrical insulator covering the shape-memory alloy. The actuator 338 can include another element to change a shape thereof instead of or in addition to the shape-memory alloy.

Figure 11:
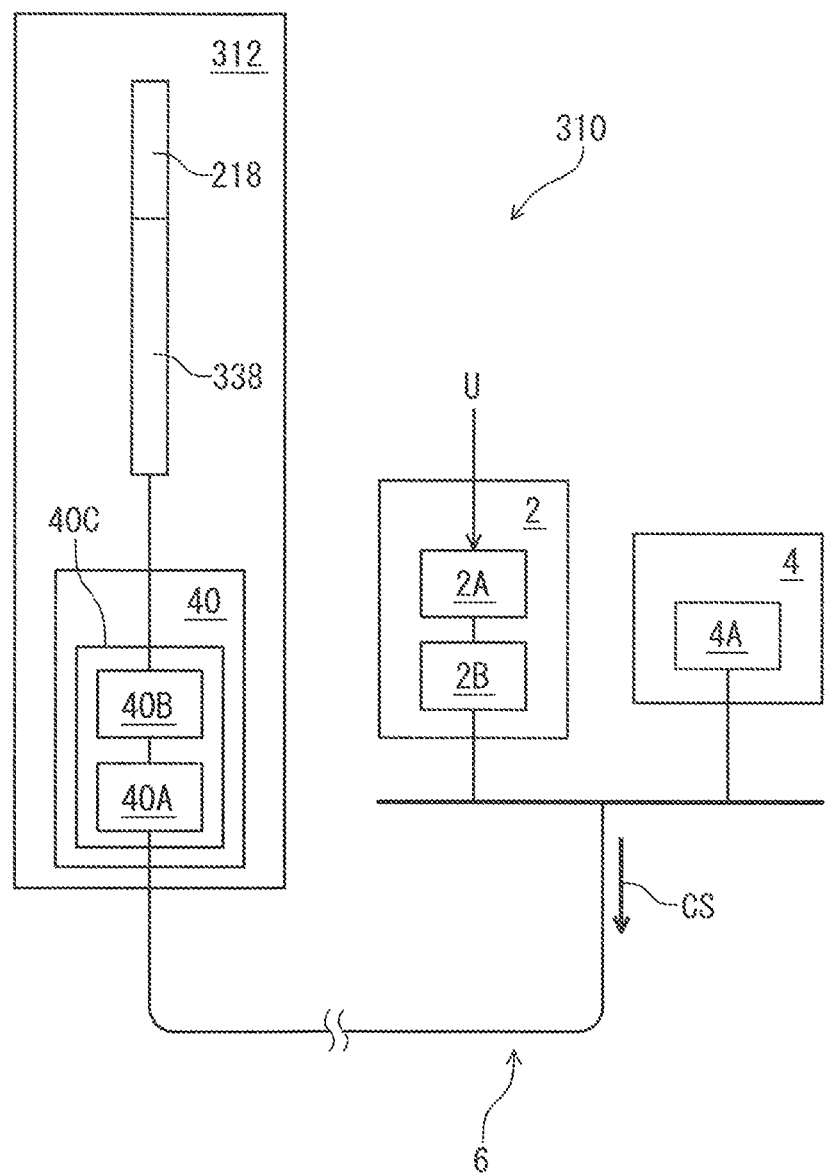
FIG. 11 is a schematic block diagram of the telescopic actuation system illustrated in FIG. 9.

As seen in FIG. 11, the telescopic apparatus 312 comprises the actuation controller 40. The actuation controller 40 is electrically connected to the actuator 338, the operating device 2, and the electric power source 4 to control the stimulation in response to the control signal CS. The actuation controller 40 is configured to control voltage and/or current (physical amount relating to the electric charge) applied from the electric power source 4 to the actuator 338 in response to the control signal CS.

The boost converter 40B is configured to increase the voltage applied from the electric power source 4 to the actuator 338 to the predetermined actuation level in response to the control signal CS. The boost converter 40B controls the voltage at the initial level while the actuation controller 40 does not receive the control signal CS from the operating device 2. The boost converter 40B increases the voltage to the predetermined actuation level while the actuation controller 40 receives the control signal CS from the operating device 2. The boost converter 40B decreases the voltage to the initial level in response to termination of the control signal CS.

As seen in FIG. 10, the actuator 338 has an initial length L32 when the stimulation is at the initial level. The initial length L32 of the actuator 338 corresponds to the closed position P21 of the movable member 218. The actuator 338 has a length L33 when the stimulation is at the predetermined actuation level. The length L33 of the actuator 338 corresponds to the open position P22 of the movable member 218. The length L33 of the actuator 338 is longer than the initial length L32 of the actuator 338.

The actuator 338 decreases in length in response to the increase in the stimulation (e.g., electric charge and heat) to generate the pulling movement of the movable member 218 while the actuation controller 40 receives the control signal CS from the operating device 2. The length of the actuator 338 changes from the initial length L32 to the length L33 while the actuation controller 40 receives the control signal CS from the operating device 2. Thus, the actuator 338 moves the movable member 218 from the closed position P21 to the open position P22 while the actuation controller 40 receives the control signal CS from the operating device 2. This changes the state of the hydraulic structure 220 from the closed state to the open state, allowing the rider to adjust the height of the saddle using the rider's weight while the rider operates the operating device 2.

The actuator 338 increases in length in response to the decrease in the stimulation (e.g., electric charge and heat) to release the pulling movement of the movable member 218 while the actuation controller 40 does not receive the control signal CS from the operating device 2. Furthermore, the actuator 338 increases in length in response to the stimulation (e.g., the biasing force of the biasing member 236) in addition to electric charge and heat to release the pulling movement of the movable member 218 while the actuation controller 40 does not receive the control signal CS from the operating device 2. The length of the actuator 338 changes from the length L33 to the initial length L32 while the actuation controller 40 does not receive the control signal CS from the operating device 2. Thus, the actuator 338 moves the movable member 218 from the open position P22 to the closed position P21 in response to termination of the control signal CS. This changes the state of the hydraulic structure 220 from the open state to the closed state, maintaining the height of the saddle at an adjusted position while the rider does not operate the operating device 2.

Fourth Embodiment

A telescopic apparatus 412 in accordance with a fourth embodiment will be described below referring to FIGS. 12 and 13. The telescopic apparatus 412 has the same structure and/or configuration as those of the telescopic apparatus 12 except for the actuator. Thus, elements having substantially the same function as those in the above embodiments will be numbered the same here and will not be described and/or illustrated again in detail here for the sake of brevity.

Figure 12:
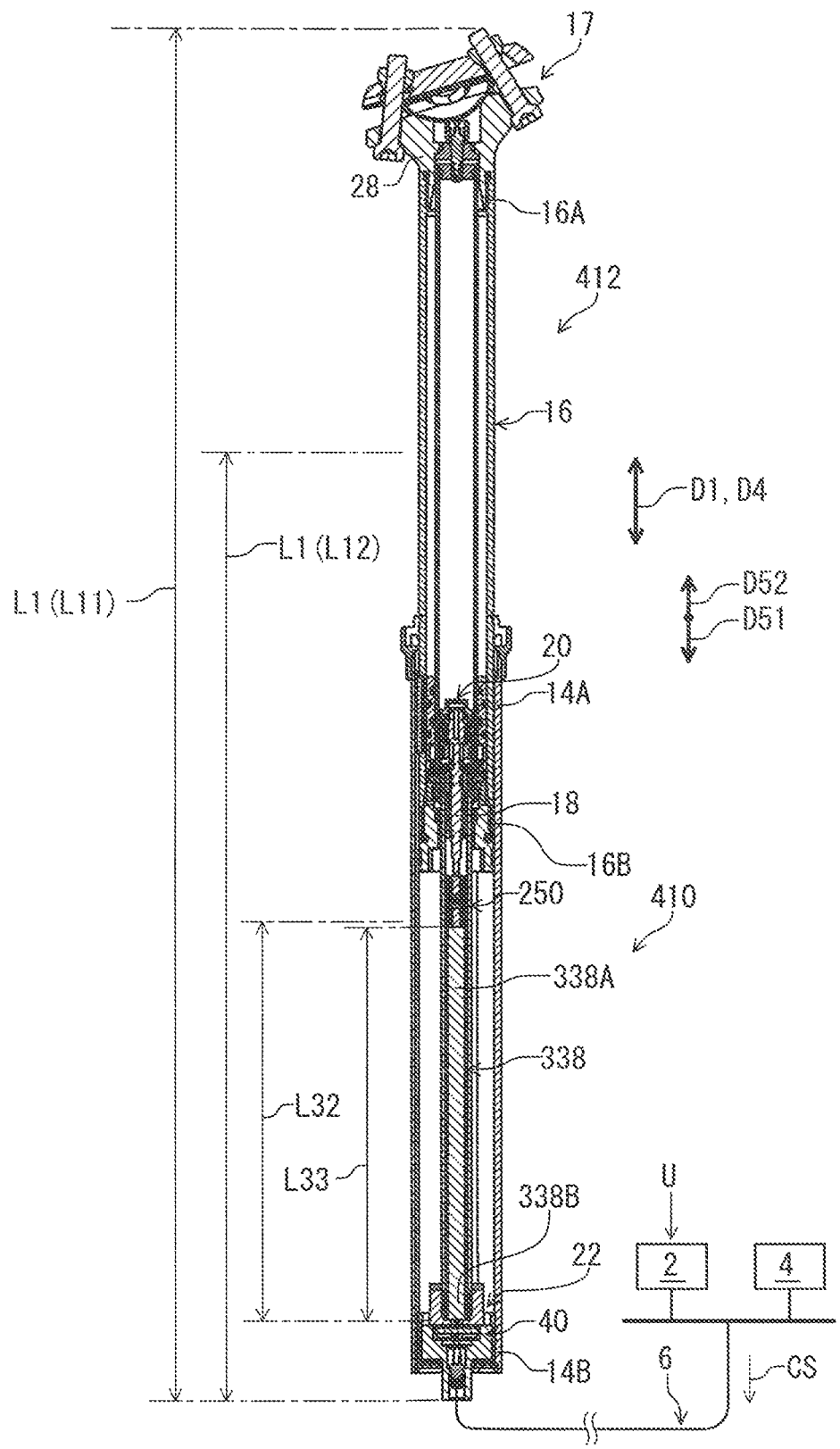
FIG. 12 is a cross-sectional view of a telescopic apparatus in accordance with a fourth embodiment, with a schematic block diagram of a telescopic actuation system.

As seen in FIG. 12, in a telescopic actuation system 410 includes the telescopic apparatus 412, the operating device 2, and the electric power source 4. The telescopic apparatus 412 comprises the first tube 14, the second tube 16, the movable member 18, and the actuator 338. The telescopic apparatus 412 further comprises the hydraulic structure 20. Thus, in the telescopic apparatus 412, the actuator 338 of the third embodiment applies to the telescopic apparatus 12 of the first embodiment.

Figure 13:
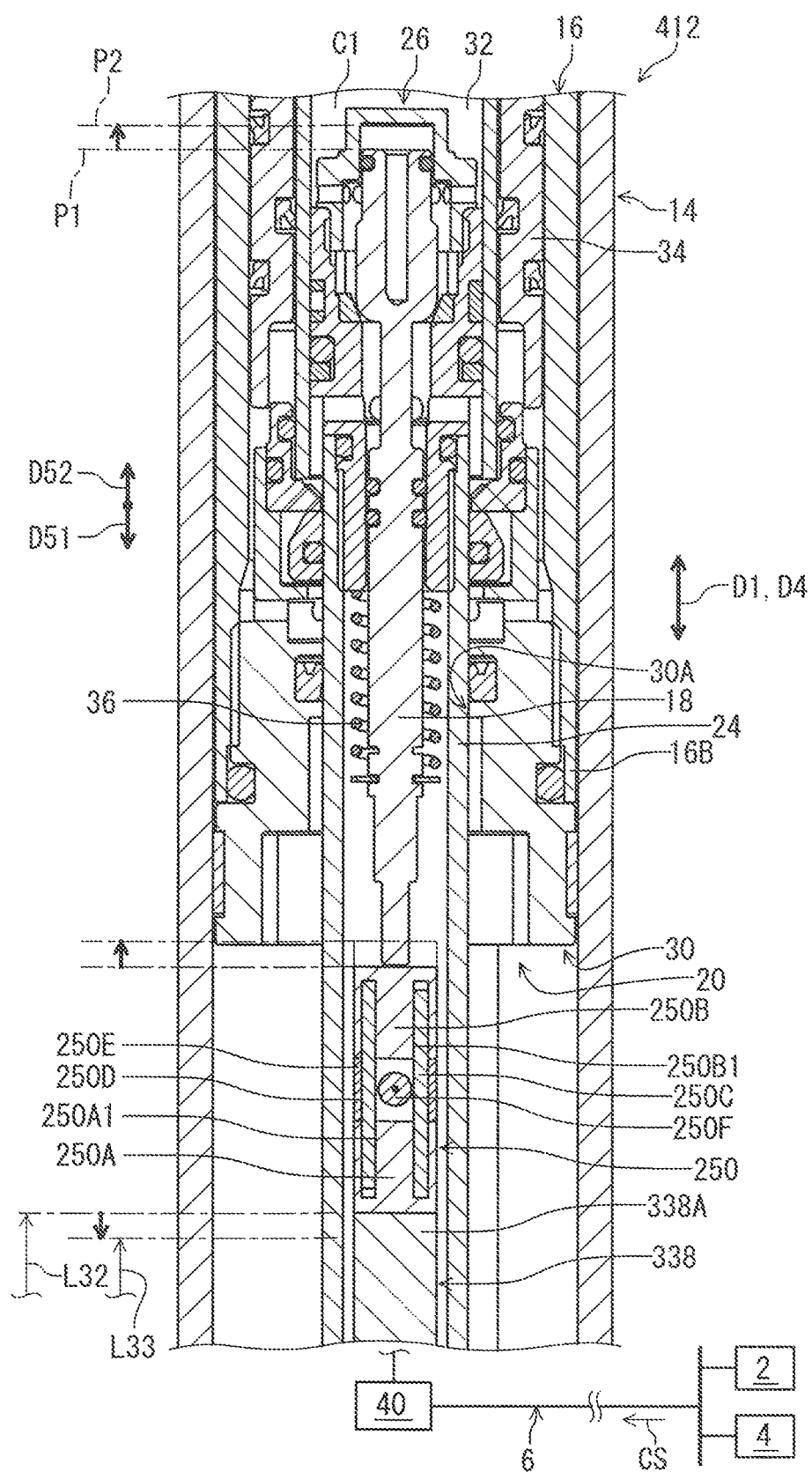
FIG. 13 is a partial cross-sectional view of the telescopic apparatus illustrated in FIG. 12.

As seen in FIG. 13, the telescopic apparatus 412 further comprises the intermediate structure 250. The intermediate structure 250 is provided between the actuator 338 and the movable member 18 to convert a movement of the actuator 338 in a first actuation direction D51 to a second actuation direction D52 in which the actuator 338 moves the movable member 18 relative to the first tube 14. The first actuation direction D51 is opposite to the second actuation direction D52.

The actuator 338 decreases in length in response to the increase in the stimulation (e.g. electric charge and heat) to generate the pushing movement of the movable member 18 while the actuation controller 40 receives the control signal CS from the operating device 2. The actuator 338 moves the first guide 250A and the first rack gear 250C in the first actuation direction D51 relative to the first tube 14. This rotates the pinion gear 250F, moving the second guide 250B, the second rack gear 250D, and the movable member 18 in the second actuation direction D52 relative to the first tube 14 against the biasing force of the biasing member 36. Thus, the actuator 338 moves the movable member 18 from the closed position P1 to the open position P2 while the rider operates the operating device 2.

The actuator 338 increases in length in response to the decrease in the stimulation (e.g. electric charge and heat) to release the pushing movement of the movable member 18 while the actuation controller 40 does not receive the control signal CS from the operating device 2. The biasing member 36 moves the movable member 18, the second guide 250B, and the second rack gear 250D in the first actuation direction D51 relative to the first tube 14. This rotates the pinion gear 250F, moving the first guide 250A and the first rack gear 250C in the second actuation direction D52 relative to the first tube 14. Namely, the actuator 338 increases in length in response to the stimulation (e.g., the biasing force of the biasing member 236) in addition to electric charge and heat to release the pushing movement of the movable member 18 while the actuation controller 40 does not receive the control signal CS from the operating device 2. Thus, the actuator 338 moves the movable member 18 from the open position P2 to the closed position P1 in response to termination of the control signal CS.

Modifications

In the first to fourth embodiments, the actuation controller 40 is configured to change the stimulation during receipt of the control signal CS. However, the configuration of the actuation controller 40 is not limited to this embodiment. For example, the actuation controller 40 can be configured to change the stimulation for a predetermined actuation time after receipt of the control signal CS regardless of the signal length of the control signal CS.

In the above embodiments, the actuation controller 40 is a single unit. However, the actuation controller 40 can be a plurality of separates units. Furthermore, in the above embodiments, the actuation controller 40 includes the boost converter 40B. However, the actuation controller 40 can have other circuitry configured to change the stimulation instead of or in addition to the boost converter 40B.

In the first to fourth embodiments, each of the telescopic apparatuses 12, 212, 312, and 412 includes a height adjustable seatpost assembly which comprises the first tube 14, the second tube 16, the movable member 18 or 218, and the actuator 38 or 338, However, the structures of the telescopic apparatuses 12, 212, 312, and 412 can apply to another apparatus such as a suspension. Furthermore, the structures of the telescopic apparatuses 12, 212, 312, and 412 can apply to another apparatus other than an apparatus for a bicycle.

In the first to fourth embodiments, the actuation controller 40, the operating device 2, and the electric power source 4 are connected to each other using the PLC technology. However, wireless technology can be used to transmit the control signal CS between the operating device 2 and the actuation controller 40. In such an embodiment, the electric power source 4 is electrically connected to the actuation controller 40, and the operating device 2 includes another electric power source.

The term "comprising" and its derivatives, as used herein, are intended to be open ended terms that specify the presence of the stated features, elements, components, groups, integers, and/or steps, but do not exclude the presence of other unstated features, elements, components, groups, integers and/or steps. This concept also applies to words of similar meaning, for example, the terms "have," "include" and their derivatives.

The terms "member," "section," "portion," "part," "element," "body" and "structure" when used in the singular can have the dual meaning of a single part or a plurality of parts.

The ordinal numbers such as "first" and "second" recited in the present application are merely identifiers, but do not have any other meanings, for example, a particular order and the like. Moreover, for example, the term "first element" itself does not imply an existence of "second element," and the term "second element" itself does not imply an existence of "first element."

The term "pair of," as used herein, can encompass the configuration in which the pair of elements have different shapes or structures from each other in addition to the configuration in which the pair of elements have the same shapes or structures as each other.

The terms "a" (or "an"), "one or more" and "at least one" can be used interchangeably herein.

Finally, terms of degree such as "substantially," "about" and "approximately" as used herein mean a reasonable amount of deviation of the modified term such that the end result is not significantly changed. All of numerical values described in the present application can be construed as including the terms such as "substantially," "about" and "approximately."

Obviously, numerous modifications and variations of the present invention are possible in light of the above teachings. It is therefore to be understood that within the scope of the appended claims, the invention may be practiced otherwise than as specifically described herein.

What is claimed is:

1. A telescopic apparatus comprising:
   a first tube;
   a second tube telescopically and movably coupled to the first tube;
   a movable member movable relative to the first tube in a telescopic direction; and
   an actuator configured to be deformable so as to move the movable member relative to the first tube in the telescopic direction, the actuator being provided in at least one of the first tube and the second tube, wherein
   the actuator is configured to deform in accordance with stimulation including at least one of electric charge and heat.

2. The telescopic apparatus according to claim 1, wherein the actuator is entirely provided in the at least one of the first tube and the second tube.

3. The telescopic apparatus according to claim 1, wherein the actuator has an elongated shape in the telescopic direction.

4. The telescopic apparatus according to claim 1, wherein the actuator is configured to extend in a first direction in accordance with the stimulation to generate a pushing movement of the movable member.

5. The telescopic apparatus according to claim 4, wherein the first direction is parallel to the telescopic direction.

6. The telescopic apparatus according to claim 4, wherein the actuator increases in length in response to an increase in the stimulation to generate the pushing movement of the movable member.

7. The telescopic apparatus according to claim 4, wherein the actuator decreases in length in response to a decrease in the stimulation to release the pushing movement of the movable member.

8. The telescopic apparatus according to claim 1, wherein the actuator is configured to shrink in a second direction in accordance with the stimulation to generate a pulling movement of the movable member.

9. The telescopic apparatus according to claim 8, wherein the second direction is parallel to the telescopic direction.

10. The telescopic apparatus according to claim 8, wherein
    the actuator decreases in length in response to an increase in the stimulation to generate the pulling movement of the movable member.

11. The telescopic apparatus according to claim 8, wherein
    the actuator increases in length in response to a decrease in the stimulation to release the pulling movement of the movable member.

12. The telescopic apparatus according to claim 1, wherein
    the actuator includes a piezoelectric element configured to change a shape of the piezoelectric element in response to the stimulation.

13. The telescopic apparatus according to claim 1, wherein
    the actuator includes a shape-memory alloy configured to change a shape of the shape-memory alloy in response to the stimulation.

14. The telescopic apparatus according to claim 1, further comprising
    a hydraulic structure including a first hydraulic chamber, a second hydraulic chamber, and a passageway provided between the first hydraulic chamber and the second hydraulic chamber, wherein
    the movable member is movable relative to the hydraulic structure to change a state of the hydraulic structure between
        a closed state where the movable member closes the passageway, and
        an open state where the movable member opens the passageway.

15. The telescopic apparatus according to claim 14, wherein
    the actuator is coupled to the movable member to move the movable member from a closed position to an open position relative to the hydraulic structure in the telescopic direction,
    the hydraulic structure is in the closed state in a state where the movable member is in the closed position, and
    the hydraulic structure is in the open state in a state where the movable member is in the open position.

16. The telescopic apparatus according to claim 1, further comprising
    an intermediate structure provided between the actuator and the movable member to convert a movement of the actuator in a first actuation direction to a second actuation direction in which the actuator moves the movable member relative to the first tube, wherein
    the first actuation direction is opposite to the second actuation direction.

17. The telescopic apparatus according to claim 1, wherein,
    the telescopic apparatus includes a height adjustable seatpost assembly comprising:
        the first tube;
        the second tube;
        the movable member; and
        the actuator.

18. The telescopic apparatus according to claim 1, wherein the movable member is movable relative to the second tube in the telescopic direction.

\* \* \* \* \*